(12) United States Patent
Govil

(10) Patent No.: US 6,727,758 B2
(45) Date of Patent: Apr. 27, 2004

(54) FAST CASCADED CLASS AB BIPOLAR OUTPUT STAGE

(75) Inventor: Alok Govil, Sleepy Hollow, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/156,248

(22) Filed: May 28, 2002

(65) Prior Publication Data

US 2003/0222718 A1 Dec. 4, 2003

(51) Int. Cl.[7] .................................................. H03F 3/18
(52) U.S. Cl. ........................ 330/264; 330/277; 330/288; 323/315
(58) Field of Search ............................. 330/64, 69, 277, 330/310, 288; 327/53; 323/315, 316

(56) References Cited

U.S. PATENT DOCUMENTS 4,267,517 A * 5/1981 Iida et al. .................... 330/253
6,259,280 B1 * 7/2001 Koelling ...................... 327/53

* cited by examiner

*Primary Examiner*—Henry Choe
(74) *Attorney, Agent, or Firm*—Kevin Simons

(57) ABSTRACT

A set of class AB output stages are cascaded to provide a class AB device circuit which utilizes relatively small transistors, low power, and virtually eliminates crossover distortion. The input may be powered by a voltage or a current source.

5 Claims, 2 Drawing Sheets

FAST CASCADED CLASS AB BIPOLAR OUTPUT STAGE

TECHNICAL FIELD

The invention relates to high voltage and power output circuits, and more particularly, to an improved cascaded configuration for a class AB bipolar output stage.

BACKGROUND AND SUMMARY OF THE INVENTION

High voltage and high power output circuits may be manufactured from bipolar output stages or bipolar structures. A typical class AR output stage utilizing bipolar structures is shown in FIG. 1.

Usually, there are several important parameters relevant to the design of a output stage. Crossover distortion should be minimized in order to provide an accurate noise-free output signal. Additionally, it is desirable to reduce static power consumption of the output stage.

Over the years, numerous variations of cascaded class AB configurations have been developed. With respect to the large number of available such configurations, each has its own advantages and/or disadvantages. Several such prior art examples are discussed below.

FIG. 1 depicts a cascaded class AB buffer utilizing bipolar transistors and several diodes as shown. Notably, there are four static current paths 201–204, leading to increased power consumption. As stated above, minimization of power consumption is a goal in class AB output stages. Thus, the arrangement of FIG. 1 is suboptimal.

FIG. 2 shows a class C Darlington output stage with biasing resistors utilizing FET technology. The arrangement of FIG. 2 would appear to consume less power than that of FIG. 1, owing to the fact that there are less current paths. It is noted however, that in the arrangement of FIG. 2, transistors M3 and M4 see the load through biasing resistors R1 and R2. For purely capacitive loads, transistors M3 and M4 must be sized properly to prevent slowing down of the circuit. Often, this means utilizing larger transistors, with higher power consumption, than desirable. Thus, the larger transistors can make up for the reduction in current paths, and a relatively high power consuming device still results.

In addition to the foregoing power consumption problem, another problem in output stages is that of crossover distortion. A prior art known technique of minimizing crossover distortion is to utilize a feedback loop to cancel such distortion. However, the implementation of such a feedback loop also results in added power consumption.

In view of the above, there exists a need in the art for an improved circuit for minimizing required current and thus power consumption of the Class AB output stage while at the same time eliminating crossover distortion.

The above and other problems with the prior art are overcome in accordance with the present invention. The present invention includes a circuit having cascaded output stages utilizing three sets of FET devices. Of the three sets of FET devices, in a preferred embodiment, a first set includes four FETs, a second set includes a different four FETs, and a third set includes two FETs. Two of the transistors from the second set and the two transistors from the third set comprise one class AB stage, and the remaining two transistors from the second set and all four transistors from the first set comprise the second class AB stage. The two stages are cascaded in a manner that reduces the required size for the transistors as well as eliminating crossover distortion. The arrangement avoids such crossover distortion without the need for a feedback loop, thereby eliminating the additional components that would otherwise be required and also minimizing power dissipation.

The circuit has the further advantage of minimizing current paths, and thus power consumption, while permitting smaller size transistors to be used, even to drive relatively highly capacitive output loads.

Further advantages of the present invention will become clear from the following detailed description and drawings.

DETAILED DESCRIPTION OF THE PREFERRED EMBODIMENT

Figure 3:
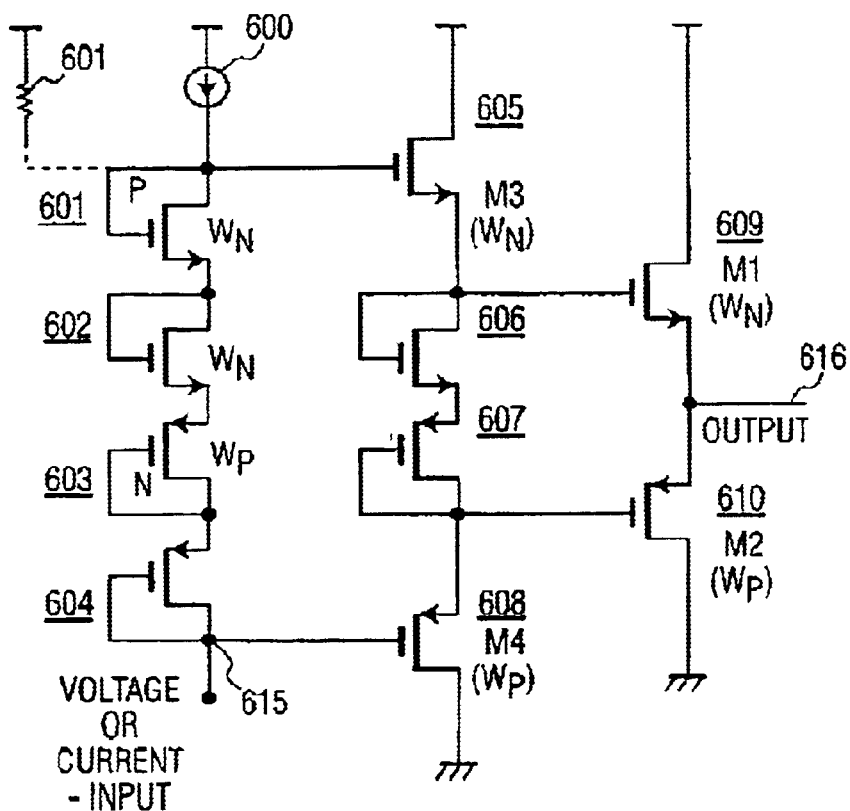
FIG. 3 shows an exemplary embodiment of the present invention utilizing ten FET devices.

FIG. 3 shows an exemplary embodiment of the present invention utilizing ten FET devices. It is understood that the particular transistors utilized are not critical to the present invention, and that other types of active devices may be utilized.

The exemplary embodiment of FIG. 3 comprises four FET devices 601–604 connected to the input power source. The source of FET 601 is connected as shown to the gate of FET 605, and the drain of FET 604 is connected to the gate of FET 608 as also shown. FETs 608, 605 and 601–604 constitute the equivalent of a single stage of a class AB output circuit. The remaining FETs 606, 607, 609 and 610 constitute a second output stage. The two output stages are connected at a junction between FET 605 and 606, and are also connected at the junction between FETs 607 and 608.

By driving the gates of FETs 606, 607, 609 and 610 from a common source as shown, the aforementioned four transistors act as a single output stage. Moreover, since FETs 605 and 608 have their respective gates tied to the gates of FETs 601 and 604 respectively, FETs 605 and 608 are part of the first stage.

Note also that in the first stage, the gates of FETs 605, 601 and 602 are connected but the gates of the remaining FETs are connected in common to a second point. In the second stage however, the gates of transistors 609 and 606 of the stage are tied to a single common point, as well as the gates of transistors 607 and 610. In summary, of the ten transistors shown, six constitute a first class AB output stage, and the remaining four constitute a second outputs stage connected in a cascaded fashion.

In operation, the power is provided to the system from source 600 through series FET devices 601–604. The signal to be amplified amplified is provided at point 615 as shown. The signal is then amplified through the consecutive AB stages and an output is seen at point 616.

Figure 1:
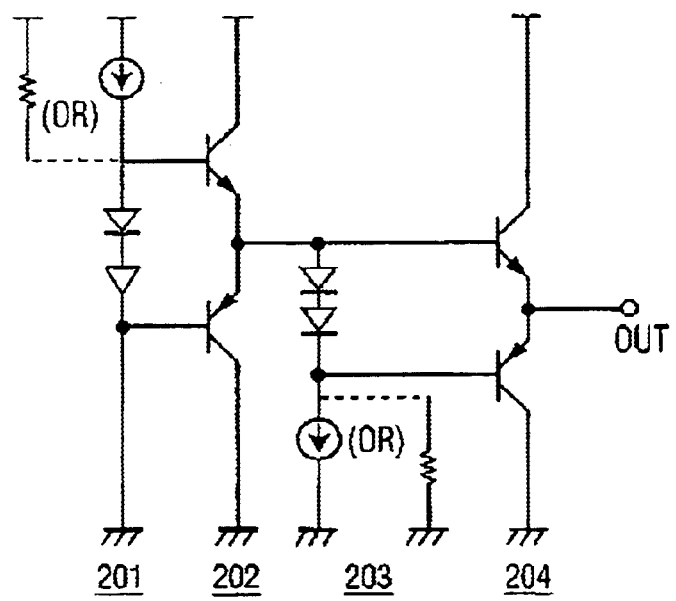
FIG. 1 shows a exemplary prior art arrangement.
Figure 2:
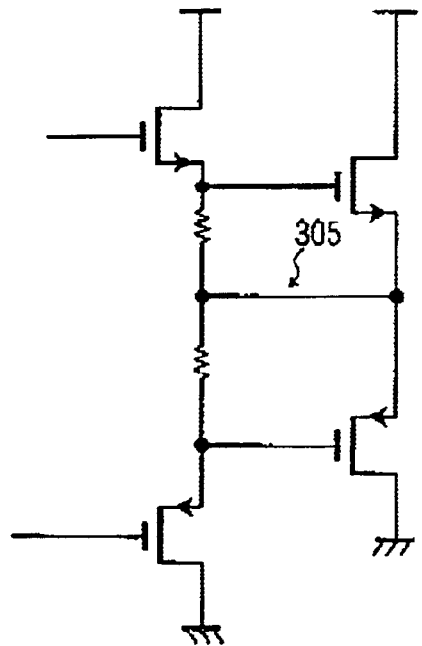
FIG. 2 depicts an additional prior art arrangement having the drawback of relatively high power consumption.

Notably, unlike the prior art arrangement of FIG. 2, FETs 605 and 608 do not see the output through biasing resistors, since the connection 305 in FIG. 2 is not present in FIG. 3. Accordingly, the arrangement of FIG. 3 permits smaller transistors utilized in the prior art arrangements or circuits with the same response times. The use of such smaller transistors provides for reduced input capacitance and thus, lower delay.

Additionally, the circuit does not generate significant crossover distortion, thereby eliminating the need for a feedback loop in most applications. This mode of operation thus reduces power consumption. It is also noted that the system has at most three current paths, unlike some prior art arrangements that include at least four such paths.

It is understood that the above describes only the preferred embodiments and is for exemplary purposes only. Other types of active devices may be utilized, and the invention is not limited to the embodiments disclosed herein. The device may be powered by a voltage source or a current source.

What is claimed is:

1. Apparatus comprising at least a first output stage and a second output stage, the first output stage comprising a first subset of FET devices connected in series along a first current path with an input, the second output stage comprising a first subset of FET devices connected in series along a second current path with an output, wherein each output stage further comprises a second subset of FET devices connected to its first subset, and the second subsets of both output stages are connected in series along a third current path whereby connecting the first and second output stages.

2. Apparatus of claim 1 wherein said first stage includes more FET devices than said second output stage.

3. Apparatus of claim 2 further comprising a voltage source for providing power.

4. Apparatus of claim 2 further comprising a current source for providing power.

5. Apparatus of claim 4 wherein said circuit is driven with a voltage input.

* * * * *